US008830156B2

(12) United States Patent  (10) Patent No.: US 8,830,156 B2
Kim et al.  (45) Date of Patent: Sep. 9, 2014

(54) GATE DRIVING CIRCUIT AND DISPLAY APPARATUS USING THE SAME

(75) Inventors: Cheol-Min Kim, Yongin (KR); Sang-Jin Pak, Yongin (KR); Min-Seok Bae, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 191 days.

(21) Appl. No.: 13/596,496

(22) Filed: Aug. 28, 2012

(65) Prior Publication Data

US 2013/0249884 A1 Sep. 26, 2013

(30) Foreign Application Priority Data

Mar. 22, 2012 (KR) .................. 10-2012-0029392

(51) Int. Cl.
*G09G 3/36* (2006.01)
*G11C 19/00* (2006.01)

(52) U.S. Cl.
USPC ............................ 345/100; 377/64

(58) Field of Classification Search
USPC ............ 345/100, 204, 212; 377/64–81
See application file for complete search history.

(56) References Cited

U.S. PATENT DOCUMENTS

| 7,050,036 | B2 * | 5/2006 | Kim et al. ............ 345/100 |
| 2005/0156856 | A1 * | 7/2005 | Jang et al. ............ 345/100 |
| 2008/0055225 | A1 | 3/2008 | Pak et al. |
| 2008/0079676 | A1 | 4/2008 | Pak et al. |
| 2011/0221736 | A1 | 9/2011 | Pak et al. |
| 2013/0009856 | A1 * | 1/2013 | Takahashi et al. ....... 345/92 |

FOREIGN PATENT DOCUMENTS

| KR | 10-2008-0020876 A | 3/2008 |
| KR | 10-2008-0030795 A | 4/2008 |
| KR | 10-2011-0102684 A | 9/2011 |

* cited by examiner

*Primary Examiner* — Rodney Amadiz
(74) *Attorney, Agent, or Firm* — Lee & Morse, P.C.

(57) ABSTRACT

A gate driving circuit includes a plurality of stages, each stage including an input unit to determine a level of voltage to input to a first node based on the first and second input signals and the first clock signal that is input according to the level of the voltage input to the first node and a first gate-off voltage that is input in response to the second clock signal, a second driving unit outputting the gate signals based on the third clock signal input according to the voltage input to the first node and a second gate-off voltage input in response to the second clock signal, and a leakage blocking unit blocking leakage current of a transistor by maintaining a level of voltage input to a third node connected to the first node via at least one transistor.

20 Claims, 14 Drawing Sheets

GATE DRIVING CIRCUIT AND DISPLAY APPARATUS USING THE SAME

CROSS-REFERENCE TO RELATED PATENT APPLICATIONS

This application claims the benefit of Korean Patent Application No. 10-2012-0029392, filed on Mar. 22, 2012, in the Korean Intellectual Property Office, the disclosure of which is incorporated herein in its entirety by reference.

BACKGROUND

1. Field

One or more of example embodiments relate to a gate driving circuit of a display apparatus and a display apparatus using the same.

2. Description of the Related Art

A display apparatus converts input data into a data signal by using a data driving unit, and controls scanning of each of a plurality of pixels by using a gate driving unit to adjust a brightness of each pixel, thereby displaying an image corresponding to the input data. The data driving unit and the gate driving unit may operate according to timing determined in response to a control signal of a timing controlling unit.

Each pixel of a liquid crystal display (LCD) apparatus includes a liquid crystal capacitor coupled to a gate line and in which a data voltage is charged, and a storage capacitor that is coupled to the liquid crystal capacitor and maintains the voltage charged in the liquid crystal capacitor. An image is displayed according to a voltage charged in the liquid crystal capacitor.

SUMMARY

One or more of the example embodiments provides a gate driving circuit that may increase an operating margin caused by a change in a threshold voltage of a transistor and may reduce a falling time of a gate signal.

According to an aspect of the example embodiments, there is provided a gate driving circuit including a plurality of stages configured to output gate signals in response to first and second input signals and in response to first through third clock signals input to the plurality of stages, wherein each of the plurality of stages includes an input unit configured to determine a level of voltage to be input to a first node based on the first input signal as a carry signal input from a previous stage and the second input signal as a carry signal input from a next stage, a first driving unit configured to output carry signals to the next stage, the carry signals being based on the first clock signal that is input according to the level of the voltage input to the first node and a first gate-off voltage that is input in response to the second clock signal, a second driving unit configured to output the gate signals based on the third clock signal that is input according to the level of the voltage input to the first node and a second gate-off voltage that is input in response to the second clock signal, and a leakage blocking unit configured to block leakage current of a transistor by maintaining a level of voltage input to a third node connected to the first node via at least one transistor.

The first gate-off voltage may be smaller than the second gate-off voltage.

The second clock signal may be an inverted signal of the first clock signal, and the first clock signal and the second clock signal may have a non-overlapping period, and the third clock signal inputted to the even-numbered stages may be an inverted signal of a third clock signal inputted to the odd-numbered stages, and the third clock signal inputted to the odd-numbered stages and the third clock signal inputted to the even-numbered stages may have a non-overlapping period.

The third clock signal may have a different voltage level from a voltage level of the first clock signal, the same phase as a phase of the first clock signal, and a falling time that precedes a falling time of the first clock signal.

The first clock signal may be a signal for swinging a gate-on voltage and the first gate-off voltage, and the third clock signal may be a signal for swinging a gate-on voltage and the second gate-off voltage.

The input unit may include a second transistor including a gate electrode connected to a first input terminal to which the first input signal is applied, a first electrode connected to a first scan direction control signal terminal to which a first scan direction control signal is applied, and a second electrode connected to the third node, a (2-1)-th transistor including a gate electrode connected to the first input terminal, a first electrode connected to the third node, and a second electrode connected to the first node, a third transistor including a gate electrode connected to a second input terminal to which the second input signal is applied, a first electrode connected to the third node, and a second electrode connected to a second scan direction control signal terminal to which a second scan direction control signal is applied, a (3-1)-th transistor including a gate electrode connected to the second input terminal, a first electrode connected to the third node, and a second electrode connected to the first node, a fourth transistor including a gate electrode connected to a second node, a first electrode connected to the third node, and a second electrode connected to a second power supply terminal to which the first gate-off voltage is applied, and a (4-1)-th transistor including a gate electrode connected to the second node, a first electrode connected to the third node, and a second electrode connected to the first node.

The first driving unit may include: a first transistor including a gate electrode connected to the first node, a first electrode connected to a first clock terminal to which the first clock signal is applied, and a second electrode connected to a first output terminal from which carry signals are outputted to the next stage, a fifth transistor including a gate electrode connected to a second node, a first electrode connected to the first output terminal, and a second electrode connected to a second power supply terminal to which the first gate-off voltage is applied, a sixth transistor including a gate electrode connected to a second clock terminal to which the second clock signal is applied, a first electrode connected to the first output terminal, and a second electrode connected to the second power supply terminal, a seventh transistor including a gate electrode connected to the first node, a first electrode connected to the second node, and a second electrode connected to the second power supply terminal, a boost capacitor connected between the first node and the first output terminal, and a coupling capacitor connected between the first clock terminal and the second node.

The second driving unit may include: a ninth transistor including a gate electrode connected to the first node, a first electrode connected to a third clock terminal to which the third clock signal is applied, and a second electrode connected to a second output terminal for outputting the gate signals, a tenth transistor including a gate electrode connected to a second node, a first electrode connected to the second output terminal, and a second electrode connected to a third power supply terminal to which the second gate-off voltage is applied, and an eleventh transistor including a gate electrode connected to a second clock terminal to which the second clock signal is applied, a first electrode connected to the second output terminal, and a second electrode connected to the third power supply terminal.

The leakage blocking unit may include an eighth transistor including a gate electrode connected to the first node, a first electrode connected to a first power supply terminal to which a gate-on voltage is applied, and a second electrode connected to the third node.

The gate driving circuit may drive a liquid crystal display (LCD) apparatus and may include a plurality of oxide thin film transistors.

According to another aspect of the example embodiments, there is provided a display apparatus including: a display panel including a plurality of pixels near where a plurality of data lines and a plurality of gate lines cross each other, a data driving unit connected to the plurality of data lines to apply data signals to the data lines, and a gate driving unit connected to the plurality of gate lines and including a plurality of stages at which gate signals are outputted in response to first and second input signals and first through third clock signals inputted to the plurality of stages, wherein each of the plurality of stages includes: an input unit for determining a level of a voltage to be inputted to a first node based on the first input signal as a carry signal inputted from a previous stage and the second input signal as a carry signal inputted from a next stage, a first driving unit for outputting carry signals based on the first clock signal that is inputted according to the level of the voltage inputted to the first node and a first gate-off voltage that is inputted in response to the second clock signal, to the next stage, a second driving unit for outputting the gate signals based on the third clock signal that is inputted according to the level of the voltage inputted to the first node and a second gate-off voltage that is inputted in response to the second clock signal, and a leakage blocking unit for blocking leakage current of a transistor by maintaining a level of a voltage inputted to a third node connected to the first node via at least one transistor.

BRIEF DESCRIPTION OF THE DRAWINGS

The above and other features and advantages of the example embodiments will become more apparent by describing in detail exemplary embodiments thereof with reference to the attached drawings, in which.

DETAILED DESCRIPTION

Figure 1:
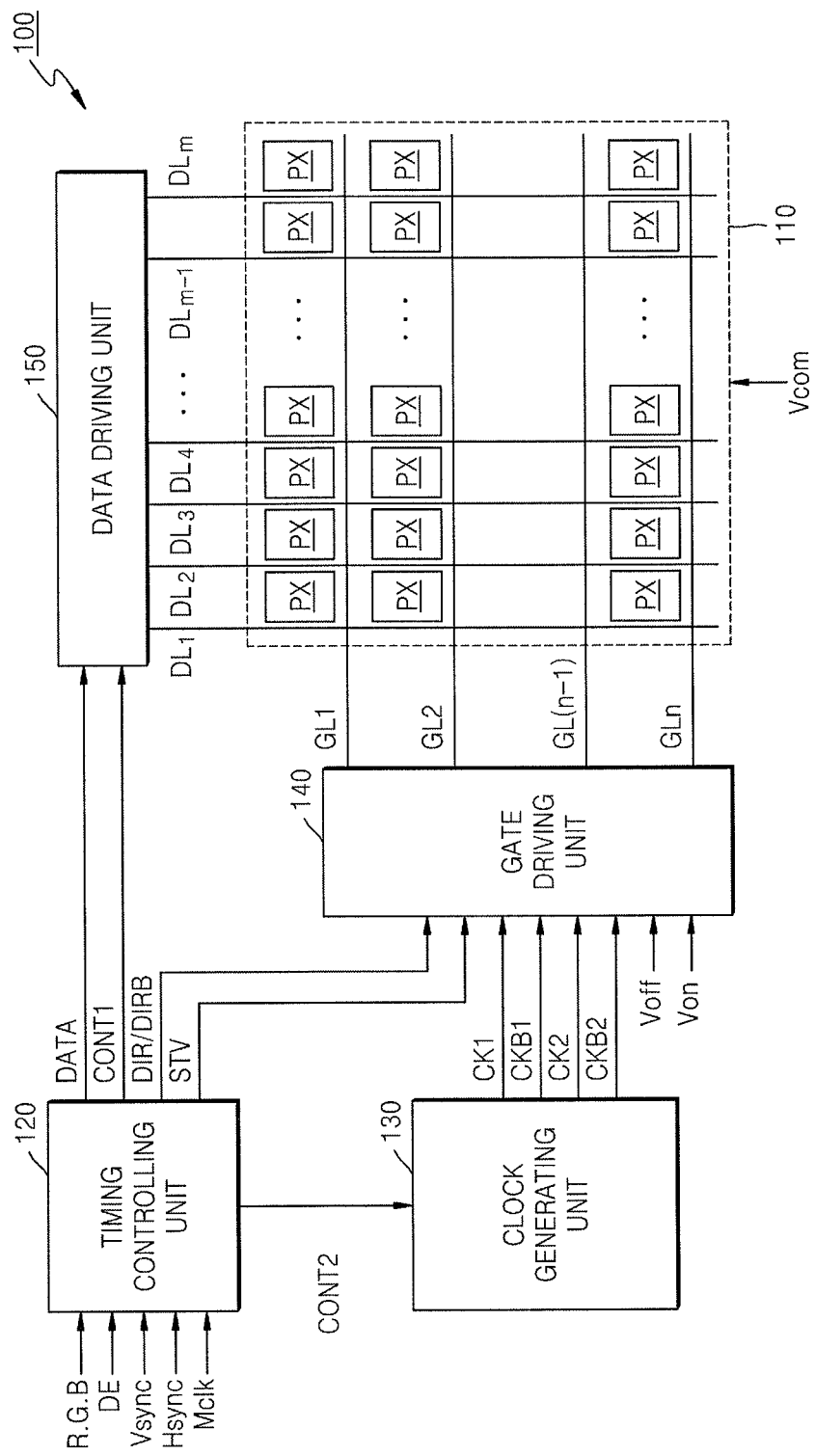
FIG. 1 is a block diagram schematically illustrating a structure of a display apparatus according to an embodiment.

As the invention allows for various changes and numerous embodiments, particular embodiments will be illustrated in the drawings and described in detail in the written description. However, this is not intended to limit the example embodiments to particular modes of practice, and it is to be appreciated that all changes, equivalents, and substitutes that do not depart from the spirit and technical scope of the example embodiments are encompassed in therein. In the description of the example embodiments, certain detailed explanations of related art are omitted when it is deemed that they may unnecessarily obscure the essence of the inventive concept.

While such terms as "first", "second", etc., may be used to describe various components, such components must not be limited to the above terms. The above terms are used only to distinguish one component from another. For example, a first component may be referred to as a second component, and likewise, a second component may be referred to as a first component without departing from the inventive scope.

The terms used in the present specification are merely used to describe particular embodiments, and are not intended to limit the example embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating a structure of a display apparatus 100 according to an embodiment.

Referring to FIG. 1, the display apparatus 100 according to the present embodiment may be implemented as a wide variety of display apparatuses, such as a liquid crystal display (LCD) apparatus, an organic electro-luminescent display apparatus, a plasma display panel, a field emission display, and the like. Hereinafter, a case of the display apparatus 100 implemented as an LCD apparatus will be described. However, aspects of the example embodiments are not limited thereto, and a gate driving circuit according to one or more embodiments may be applied to a wide variety of display apparatuses.

The display apparatus 100 according to the present embodiment includes a liquid crystal panel 110, a timing controlling unit 120, a clock generating unit 130, a gate driving unit 140, and a data driving unit 150.

The liquid crystal panel 110 includes a plurality of gate lines GL1 to GLn, a plurality of data lines DL1 to DLm, and a plurality of pixels PX. The plurality of gate lines GL1 to GLn are spaced apart from each other by a predetermined distance in rows and transmit gate signals outputted from the gate driving unit 140. The plurality of data lines DL1 to DLm are spaced apart from each other by a predetermined distance in columns and transmit data signals outputted from the data driving unit 150. The plurality of gate lines GL1 to GLn and the plurality of data lines DL1 to DLm are arranged in a matrix form, and pixels PX are formed at intersection regions of the gate lines GL1 to GLn and the data lines DL1 to DLm.

Figure 2:
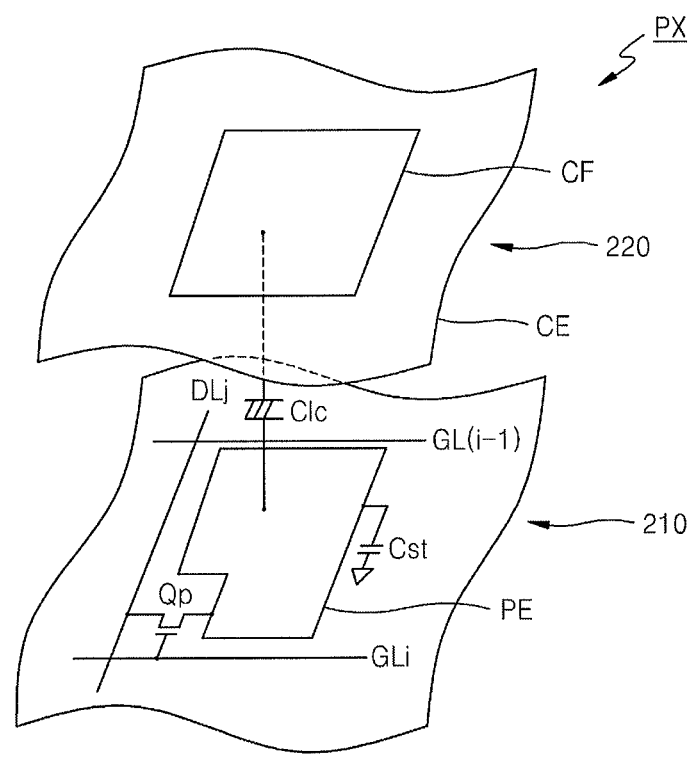
FIG. 2 is a schematic view of a pixel according to an embodiment.

FIG. 2 is a view of a structure of a pixel PX in the liquid crystal panel 110 according to an embodiment.

Referring to FIG. 2, the liquid crystal panel 110 includes a liquid crystal layer (not shown) interposed between a first substrate 210 and a second substrate 220. On the first substrate 210, the plurality of gate lines GL1 to GLn, the plurality of data lines DL1 to DLm, a pixel switching element Qp, and a pixel electrode PE are formed. On the second substrate 220, a color filter CF and a common electrode CE are formed. Unlike in FIG. 2, the color filter CF may be disposed on or under the pixel electrode PE of the first substrate 210.

For example, a pixel PX, which is connected to an i-th gate line GLi (where i is a natural number that is equal to or greater than 1 and equal to or less than n) and a j-th data line DLj (where j is a natural number that is equal to or greater than 1 and equal to or less than m), includes a liquid crystal capacitor Clc, a storage capacitor Cst, and the pixel switching element Qp. The pixel switching element Qp includes a gate electrode connected to the gate line GLi, a first electrode connected to the data line DLj, and a second electrode connected to the pixel electrode PE. The liquid crystal capacitor Clc and the storage capacitor Cst are connected to the second electrode of the pixel switching element Qp via the pixel electrode PE.

The liquid crystal capacitor Clc is constituted by using the pixel electrode PE of the first substrate 210 and the common electrode CE of the second substrate 220 as two electrodes and includes a liquid crystal layer that acts as a dielectric material between the two electrodes. A common electrode voltage Vcom (in FIG. 1) is applied to the common electrode CE. Light transmittance of the liquid crystal layer is adjusted according to a voltage applied to the pixel electrode PE, and a brightness of each pixel PX is adjusted.

The pixel electrode PE may be connected to the data line Dj via the pixel switching element Qp. If the gate electrode of the pixel switching element Qp is connected to the gate line GLi and a gate-on voltage Von is applied to the gate line GLi, a data signal transmitted via the data line DLj is applied to the pixel electrode PE.

The storage capacitor Cst is configured in such a way that the pixel electrode PE and an additional signal line (not shown) that is formed on the first substrate 210 in parallel to the gate line GLi, for example, a storage line, overlap with each other with an insulator therebetween. A common voltage or a predetermined voltage for the storage capacitor Cst may be applied to the additional signal line (not shown).

The pixel switching element Qp may be an amorphous silicon (a-Si) thin film transistor (TFT).

The first substrate 210 may be formed wider than the second substrate 220 and may include a non-display unit in which an image is not displayed. In some embodiments, the gate driving unit 140 may be disposed in part of the non-display unit of the first substrate 210.

Referring back to FIG. 1, the timing controlling unit 120 receives input image signals R, G, and B from an external graph controller (not shown) and input control signals for controlling display of the input image signals R, G, and B. The input control signals include a vertical synchronous signal Vsync, a horizontal synchronous signal Hsync, a main clock signal Mclk, a data enable signal DE, and the like. The timing controlling unit 120 generates a data driving unit control signal CONT1 and a clock generating unit control signal CONT2 based on the input control signals and provides the data driving unit control signal CONT1 and the clock generating unit control signal CONT2 to the data driving unit 150 and the clock generating unit 130, respectively. The data driving unit control signal CONT1 as a signal for controlling an operation of the data driving unit 150 includes a horizontal start signal for starting the operation of the data driving unit 150 and a load signal for instructing an output of a data voltage, or the like. The control generating unit control signal CONT2 may include a gate clock signal for determining an output time of the gate-on voltage Von and an output enable signal for determining a pulse width of the gate-on voltage Von, or the like.

The data driving unit 150 receives an image data signal DATA and the data driving unit control signal CONT1 and provides data signals corresponding to the image data signal DATA to the data lines DL1 to DLm. The data driving unit 150 as an integrated circuit (IC) may be connected to the liquid crystal panel 110 in the form of a tape carrier package (TCP) or may be formed on the non-display unit of the liquid crystal panel 110.

In addition, the timing controlling unit 120 may provide a start signal STV and first and second scan direction control signals DIR and DIRB to the gate driving unit 140. The first and second scan direction control signals DIR and DIRB may control the order of periods in which the gate-on voltage Von is applied to the gate lines GL1 to GLn, respectively, i.e., turn-on periods. For example, when the first scan direction control signal DIR is at a high level and the second scan direction control signal DIRB is at a low level, the turn-on periods are first provided to a first gate line GL1 and are sequentially provided to second through n-th gate lines GL2 to GLn. Hereinafter, such an operating mode is referred to as a forward scan mode. Alternatively, when the first scan direction control signal DIR is at a low level and the second scan direction control signal DIRB is at a high level, the turn-on periods are first provided to an n-th gate line GLn and are sequentially provided to (n−1)-th through first gate lines GL(n−1) to GL1. Hereinafter, such an operating mode is referred to as a backward scan mode.

The clock generating unit 130 may output a first clock signal CK1, a first inverted clock signal CKB1, a second clock signal CK2, and a second inverted clock signal CKB2 by using the clock generating control signal CONT2. The first inverted clock signal CKB1 may be an inverted signal of the first clock signal CK1. The second inverted clock signal CKB2 may be an inverted signal of the second clock signal CK2. The first clock signal CK1 and the first inverted clock signal CKB1 are non-overlapping clock signals having a non-overlapping period. The second clock signal CK2 and the second inverted clock signal CKB2 are non-overlapping clock signals having a non-overlapping period. The second clock signal CK2 has the same phase as that of the first clock signal CK1, is repeatedly at a high level and a low level, and has a falling time that precedes a falling time of the first clock signal CK1 by a predetermined time. Thus, an inverted period partially exists between the first clock signal CK1 and the second clock signal CK2. The second inverted clock signal CKB2 has the same phase as that of the first inverted clock signal CKB1, is repeatedly at a high level and at a low level, and has a falling time that precedes a falling time of the first inverted clock signal CKB1. Thus, an inverted period partially exists between the first inverted clock signal CKB1 and the second inverted clock signal CKB2. Voltage levels (potentials) of the second clock signal CK2 and the second inverted clock signal CKB2 may be different from those of the first clock signal CK1 and the first inverted clock signal CKB1. For example, the first clock signal CK1 and the first inverted clock signal CKB1 may be signals for swinging the gate-on voltage Von and a first gate-off voltage Voff1. The second clock signal CK2 and the second inverted clock signal CKB2 may be signals for swinging the gate-on voltage Von and a second gate-off voltage Voff2.

The gate driving unit 140 provides gate signals to the gate lines GL1 to GLn by using the start signal STV, the first and second scan direction control signals DIR and DIRB, the first and second clock signals CK1 and CK2, the first and second inverted clock signals CKB1 and CKB2, and the gate-on and -off voltages Von and Voff. The gate-off voltage Voff may include a first gate-off voltage Voff1 and a second gate-off voltage Voff2. A magnitude of the first gate-off voltage Voff1 is smaller than that of the second gate-off voltage Voff2. For example, the gate-on voltage Von may be 15 V, the first gate-off voltage Voff1 may be −12 V, and the second gate-off voltage Voff2 may be −10 V.

The structure of the display apparatus 100 described with reference to FIGS. 1 and 2 is just an example, and one or more embodiments may be modified in various ways, and aspects of the example embodiments are not limited to FIGS. 1 and 2. For example, detailed structures of pixels PX may be modified in various ways. In addition, the types of input/output signals of the timing controlling unit 120, the clock generating unit 130, the gate driving unit 140, and the data driving unit 150 may vary according to one or more embodiments. Two or more among the timing controlling unit 120, the clock generating unit 130, the gate driving unit 140, and the data driving unit 150 may be combined to be configured as one chip.

Figure 3:
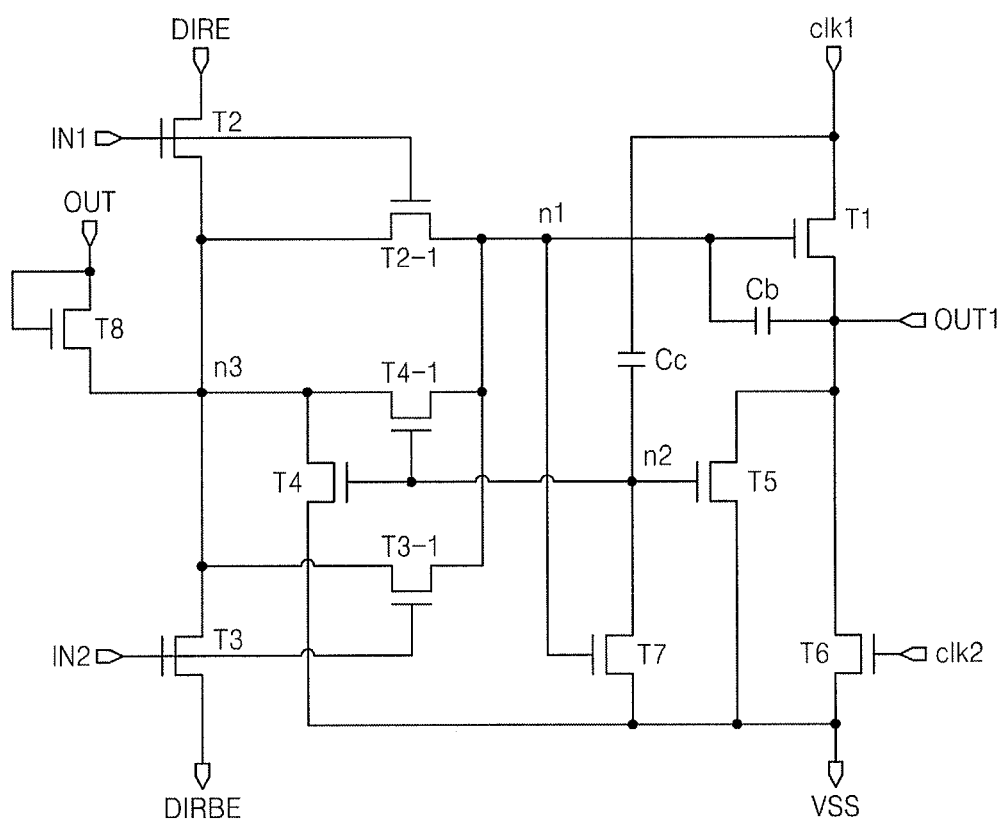
FIG. 3 is a circuit diagram of a structure of an arbitrary stage of a general gate driving circuit.
Figure 4:
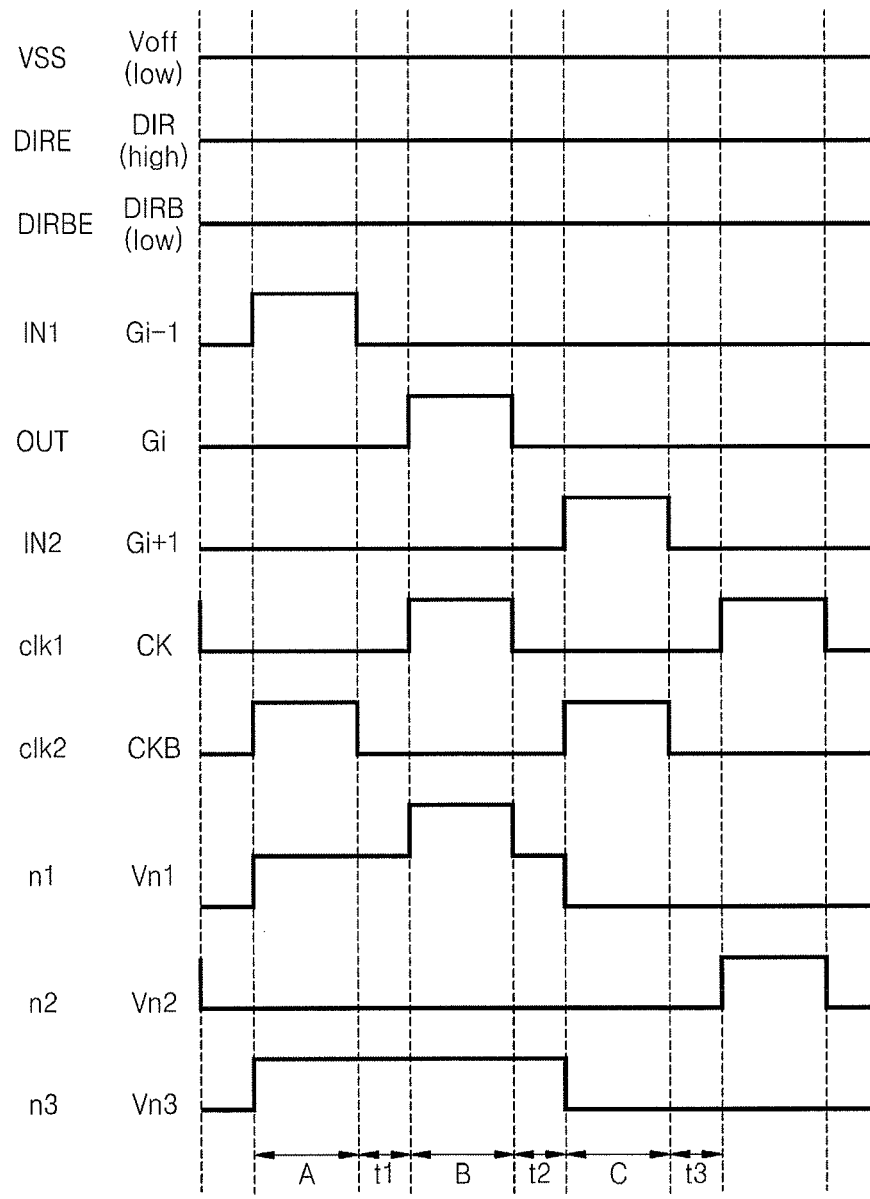
FIG. 4 is a timing diagram illustrating an operation of the general gate driving circuit illustrated in FIG. 3.

FIG. 3 is a circuit diagram of a structure of an arbitrary stage of a general gate driving circuit, and FIG. 4 is a timing diagram illustrating an operation of the gate driving circuit illustrated in FIG. 3.

Referring to FIG. 3, the general gate driving circuit may be implemented as a shift register including a plurality of stages ST1 to STn. An arbitrary stage STi includes first through eighth transistors T1 to T8.

Hereinafter, an operation of the general gate driving circuit in a forward scan mode in which the first scan direction control signal DIR is applied at a high level and the second scan direction control signal DIRB is applied at a low level will be described.

FIG. 4 is a timing diagram illustrating an operation of the general gate driving circuit illustrated in FIG. 3.

Referring to FIGS. 3 and 4, in a period A, a gate voltage Gi−1 at a high level is inputted to a first input terminal IN1 from a previous stage, and the second transistor T2 and a (2-1)-th transistor T2-1 are turned on in response to the gate voltage Gi−1 at a high level from the previous stage, and the first scan direction control signal DIR at a high level is inputted to a first node n1 and a third node n3. Thus, the first transistor T1 and the seventh transistor T7 are turned on, a clock signal CK at a low level is inputted to an output terminal OUT1, and a gate-off voltage Voff at a low level is inputted to a second node n2. Since the second node n2 is at a low level, the fourth transistor T4, a (4-1)-th transistor T4-1, and the fifth transistor T5 are in a turned off state. The sixth transistor T6 is turned on in response to an inverted clock signal CKB at a high level, and a gate-off voltage Voff at a low level is inputted to the output terminal OUT1. A gate voltage Gi+1 at a low level is inputted to a second input terminal IN2 from the next stage, and a third transistor T3 and a (3-1)-th transistor T3-1 are turned off. The eighth transistor T8 is turned off in response to a gate voltage Gi at a low level outputted from the output terminal OUT.

In a period B, the gate voltage Gi−1 at the previous stage transits from a high level to a low level, and the second transistor T2 and the (2-1)-th transistor T2-1 are in a turned off state, and thus, the third node n3 and the first node n1 are floated. Thus, the third node n3 and the first node n1 are maintained at a high level, the first transistor T1 and the seventh transistor T7 are maintained in a turned on state, and a clock signal CK at a high level is inputted to the output terminal OUT1, and the gate-off voltage Voff at a low level is inputted to the second node n2. Since the second node n2 is at a low level, the fourth transistor T4, the (4-1)-th transistor T4-1, and the fifth transistor T5 are maintained in a turned off state. The gate voltage Gi+1 at a low level is continuously inputted to the second input terminal IN2 from the next stage, and the third transistor T3 and the (3-1)-th transistor T3-1 are maintained in a turned off state. The eighth transistor T8 is turned on in response to the gate voltage Gi at a high level outputted from the output terminal OUT, and the gate voltage Gi at a high level is inputted to the third node n3. When the output terminal OUT1 is at a high level, the first node n1 is maintained at a higher level than in the period A by using a boost capacitor Cb.

In a period C, the gate voltage Gi+1 that transits from the low level to the high level is inputted to the second input terminal IN2 from the next stage, and the third transistor T3 and the (3-1)-th transistor T3-1 are turned on. Thus, a second scan direction control signal DIRB at a low level is inputted to the third node n3 and the first node n1. Thus, the first transistor T1 and the seventh transistor T7 are turned off, and the gate-off voltage Voff at a low level is inputted to the output terminal OUT1 via the sixth transistor T6 that is turned on in response to an inverted clock signal CKB at a high level.

Figure 5A:
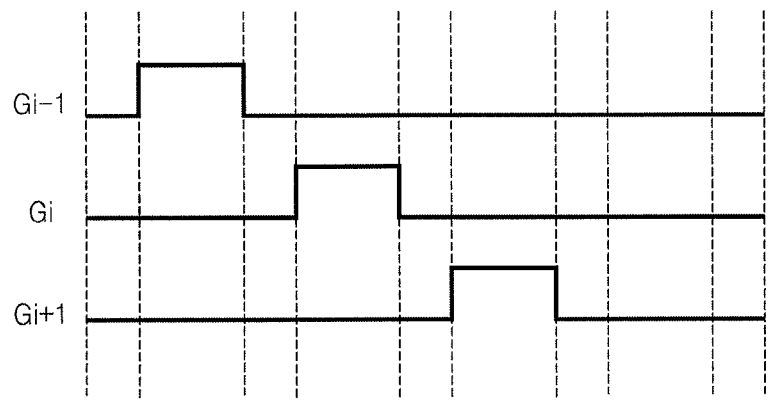
FIG. 5A is a timing diagram of actual gate signals output from a gate driving circuit.
Figure 5B:
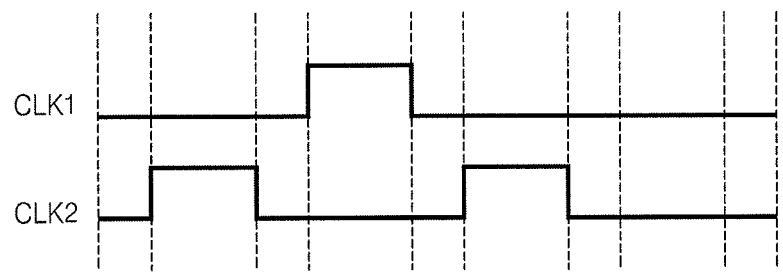
FIG. 5B is a timing diagram of actual clock signals used in a gate driving circuit.

FIG. 5A is a timing diagram of actual gate signals outputted from a gate driving circuit, and FIG. 5B is a timing diagram of actual clock signals used in a gate driving circuit.

As illustrated in FIG. 5A, in order to prevent gate signals Gi−1 and Gi, Gi and Gi+1, . . . , or the like, from overlapping with each other, each gate signal has a minimum margin time. In addition, clock signals used in the gate driving circuit, as illustrated in FIG. 5B, are non-overlapping clock signals, i.e., two clock signals CLK1 and CLK2 having different falling and rising times.

As illustrated in the timing diagram of FIG. 4, the gate signal Gi is at a low level at a boundary period between the periods A and B and at a boundary period between the periods B and C, i.e., in a period t1 and a period t2, according to the signal timing illustrated in FIGS. 5A and 5B, so that the third node n3 is floated. In this case, when a threshold voltage Vth of a transistor is changed to a negative voltage, a leakage current flows through the second transistor T2, the third transistor T3, and the eighth transistor T8 so that the third node n3 is not maintained at a high level and malfunctions, and an operating margin may be reduced. The operating margin is a significant characteristic in an oxide thin film transistor in which the threshold voltage Vth is vulnerable to be changed to a negative voltage. In addition, in a period t3 after the period C, since the first node n1 is at a low level, the inverted clock signal CKB is also at a low level, and an output of gate signal Gi is floated, an output of gate signals may be reversely affected by external noise, such as data line coupling, or the like.

Figure 6:
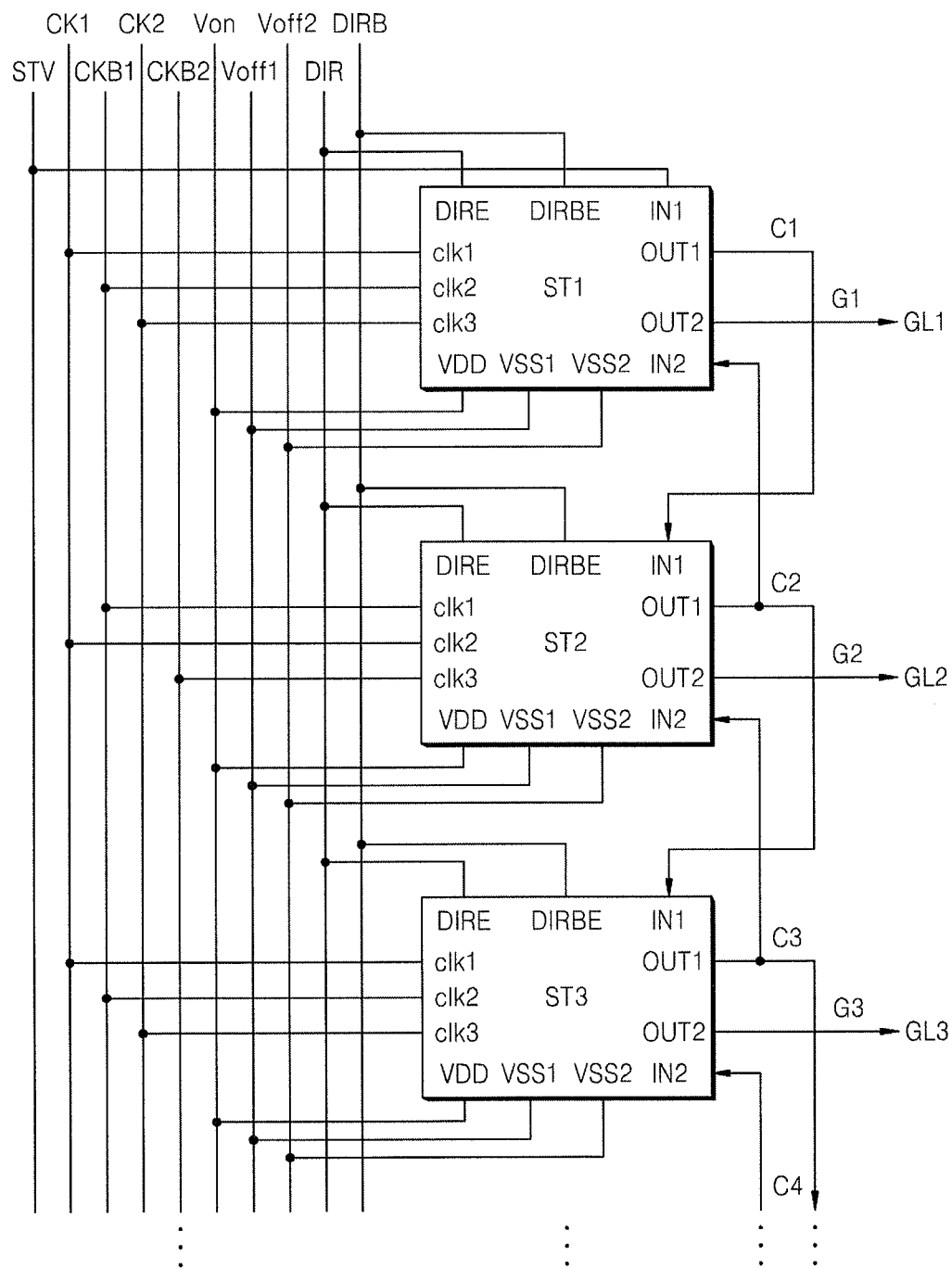
FIG. 6 is a block diagram of a gate driving circuit according to an embodiment.

FIG. 6 is a block diagram of a structure of a gate driving circuit according to an embodiment.

Referring to FIG. 6, the gate driving unit 140 according to the example embodiments includes at least one gate driving IC, and each gate driving IC includes a gate driving circuit according to the present embodiment. The gate driving circuit according to the present embodiment may be implemented as a shift register including a plurality of stages ST1 to STn. The number of stages may be selected by a designer. Each stage STi includes a first input terminal IN1, a second input terminal IN2, first through third clock terminals clk1, clk2, and clk3, first through third power supply terminals VDD, VSS1, and VSS2, a first scan direction control signal terminal DIRE, a second scan direction control signal terminal DIRBE, and first and second output terminals OUT1 and OUT2. For convenience of explanation, only first through third stages ST1 to ST3 are shown in FIG. 6.

In the current embodiment, first and second clock signals CK1 and CK2, and first and second inverted clock signals CKB1 and CKB2 are used, and clock signals and inverted clock signals that vary according to positions of stages are received. For example, the first and second clock signals CK1 and CK2 and the first inverted clock signal CKB1 are received by odd-numbered stages ST1, ST3, and . . . , and the first clock signal CK1 and the first and second inverted clock signals CKB1 and CKB2 are received by even-numbered stages ST2, ST4, and . . . .

At the odd-numbered stages ST1, ST3, and . . . , the first clock signal CK1 is inputted to the first clock terminal clk1, and the first inverted clock signal CKB1 is inputted to the second clock terminal clk2, and the second clock signal CK2 is inputted to the third clock terminal clk3. The first input terminal IN1 is connected to the first output terminal OUT1 at the previous stage, and the second input terminal IN2 is connected to the first output terminal OUT1 at the next stage. The first output terminal OUT1 is connected to the second input terminal IN2 at the previous stage and the first input terminal IN1 at the next stage, and the second output terminal OUT2 is connected to a gate line GL. A gate-on voltage Von is inputted to the first power supply terminal VDD, and a first gate-off voltage Voff1 is inputted to a second power supply terminal VSS1, and a second gate-off voltage Voff2 is inputted to the third power supply terminal VSS2. A first scan direction control signal DIR is inputted to the first scan direction control signal terminal DIRE, and a second scan direction control signal DIRB is inputted to the second scan direction control signal terminal DIRBE.

However, at the first stage ST1 to which the previous stage does not exist, a start signal STV is inputted to the first input terminal IN1, and the first output terminal OUT1 is connected only to the first input terminal IN1 at the next stage.

At the even-numbered stages ST2, ST4, and . . . , the first inverted clock signal CKB1 is inputted to the first clock terminal clk1, and the first clock signal CK1 is inputted to the second clock terminal clk2, and the second inverted clock signal CKB2 is inputted to the third clock terminal clk3. Since connecting the first input terminal IN1, the second input terminal IN2, the first output terminal OUT1, the second output terminal OUT2, the first scan direction control signal terminal DIRE, the second scan direction control signal terminal DIRBE, the first power supply terminal VDD, and the second and the third power supply terminals VSS1 and VSS2 is the same as in the odd-numbered stages ST1, ST3, and . . . , the description thereof is omitted.

At an n-th stage Stn (not shown) to which the next stage does not exist, the first output terminal OUT1 may be connected only to the second input terminal IN2 at the previous stage STn−1, and the start signal STV may be applied to the second output terminal OUT2.

Output signals C1, C2, and . . . , which are outputted from the first output terminal OUT1 at each stage, are carry signals. The carry signals are inputted to the first input terminal IN1 at the next stage and the second input terminal IN2 at the previous stage. Output signals G1, G2, and . . . , which are outputted from the second output terminal OUT2 at each stage, are gate signals. The gate signals may be output to pixels PX through gate lines GL1 to GLn.

The present embodiment is directed to a structure of a shift register that is driven in response to the clock signal CK and the inverted clock signal CKB. However, the technical spirit of the example embodiments is based on a driving unit at each stage including a first driving unit for outputting carry signals and a second driving unit for outputting gate signals, which are connected in parallel. The technical spirit of the example embodiments may be applied to all general shift registers having a driving unit at each stage including a first driving unit and a second driving unit connected in parallel.

Figure 7:
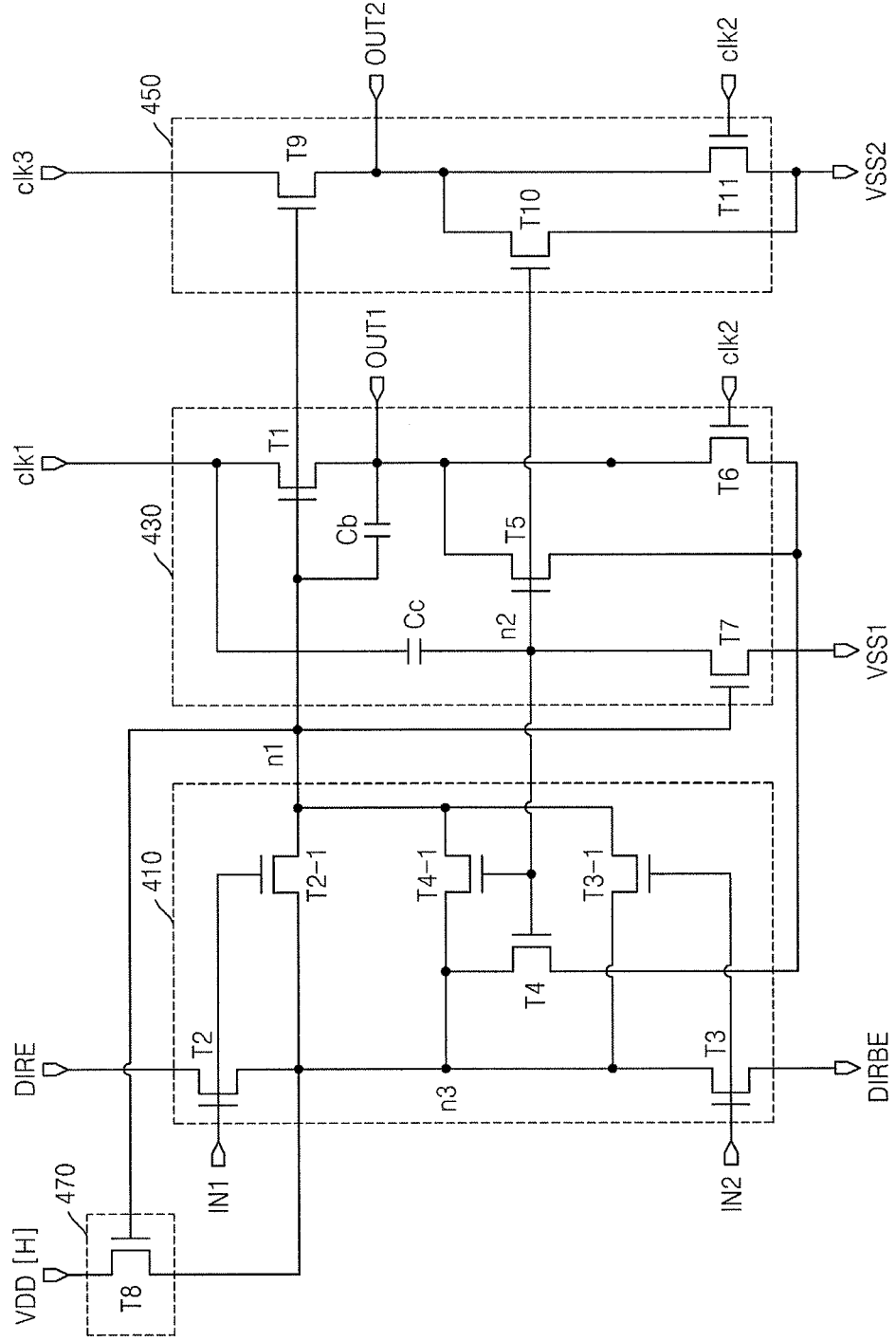
FIGS. 7 and 8 are circuit diagrams of arbitrary stages of the gate driving circuit illustrated in FIG. 6.

FIG. 7 is a circuit diagram of a structure of an arbitrary stage STi of the gate driving circuit illustrated in FIG. 6.

Referring to FIG. 7, the stage STi of the gate driving circuit includes first through third nodes n1, n2, and n3, an input unit 410, a first driving unit 430, a second driving unit 450, and a leakage blocking unit 470.

The gate driving circuit according to embodiments may be implemented using an n-type transistor, a p-type transistor, or a complementary metal oxide semiconductor (CMOS) transistor. Hereinafter, the gate driving circuit according to an embodiment that is implemented using an n-type transistor will be described. However, aspects of the example embodiments are not limited to the embodiment in which the gate driving circuit is implemented with an n-type transistor and embodiments of the gate driving circuit may be implemented with a p-type transistor or a CMOS. A transistor of the gate driving circuit may be an oxide thin film transistor.

The input unit 410 determines a level of a voltage to be inputted to the first node n1 based on a carry signal inputted from the previous stage and a carry signal inputted from the next stage. The input unit 410 includes a second transistor T2, a (2-1)-th transistor T2-1, a third transistor T3, a (3-1)-th transistor T3-1, a fourth transistor T4, and a (4-1)-th transistor T4-1.

The second transistor T2 includes a gate electrode connected to the first input terminal IN1, a first electrode connected to the first scan direction control signal terminal DIRE, and a second electrode connected to the third node n3. The (2-1)-th transistor T2-1 includes a gate electrode connected to the first input terminal IN1, a first electrode connected to the third node n3, and a second electrode connected to the first node n1. The third transistor T3 includes a gate electrode connected to the second input terminal IN2, a first electrode connected to the third node n3, and a second electrode connected to the second scan direction control signal terminal DIRBE. The (3-1)-th transistor T3-1 includes a gate electrode connected to the second input terminal IN2, a first electrode connected to the third node n3, and a second electrode connected to the first node n1. The fourth transistor T4 includes a gate electrode connected to the second node n2, a first electrode connected to the third node n3, and a second electrode connected to the second power supply terminal VSS1. The (4-1)-th transistor T4-1 includes a gate electrode connected to the second node n2, a first electrode connected to the third node n3, and a second electrode connected to the first node n1.

The first driving unit 430 generates carry signals based on a signal inputted to the first clock terminal clk1 according to a level of a voltage inputted to the first node n1 and a first gate-off voltage Voff1 that is inputted in response to a signal inputted to the second clock terminal clk2, and outputs the carry signals to the next stage. The first driving unit 430 includes a first transistor T1, fifth through seventh transistors T5, T6, and T7, a boost capacitor Cb, and a coupling capacitor Cc.

The first transistor T1 includes a gate electrode connected to the first node n1, a first electrode connected to the first clock terminal clk1, and a second electrode connected to the first output terminal OUT1. The boost capacitor Cb is connected between the first node n1 and the first output terminal OUT1. The fifth transistor T5 includes a gate electrode connected to the second node n2, a first electrode connected to the first output terminal OUT1, and a second electrode connected to the second power supply terminal VSS1. The sixth transistor T6 includes a gate electrode connected to the second clock terminal clk2, a first electrode connected to the first output terminal OUT1, and a second electrode connected to the second power supply terminal VSS1. The seventh transistor T7 includes a gate electrode connected to the first node n1, a first electrode connected to the second node n2, and a second electrode connected to the second power supply terminal VSS1. The coupling capacitor Cc is connected between the first clock terminal clk1 and the second node n2. The first transistor T1 generates an output signal according to the voltage inputted to the first node n1 and outputs the output signal to the first output terminal OUT1. The boost capacitor Cb guarantees a voltage difference between the gate electrode and the second electrode of the first transistor T1 so that the output signal may be full swung.

The second driving unit 450 generates gate signals based on a signal inputted to a third clock terminal clk3 according to the level of the voltage inputted to the first node n1 and a second gate-off voltage that is input in response to a signal inputted to a second clock terminal clk2, and outputs the gate signals to the next stage. The second driving unit 450 includes ninth through eleventh transistors T9, T10, and T11.

The ninth transistor T9 includes a gate electrode connected to the first node n1, a first electrode connected to the third clock terminal clk3, and a second electrode connected to a second output terminal OUT2. The tenth transistor T10 includes a gate electrode connected to the second node n2, a first electrode connected to the second output terminal OUT2, and a second electrode connected to a third power supply terminal VSS2. The eleventh transistor T11 includes a gate electrode connected to the second clock terminal clk2, a first electrode connected to the second output terminal OUT2, and a second electrode connected to the third power supply terminal VSS2.

In the current embodiment, the first gate-off voltage Voff1 inputted to the second power supply terminal VSS1 of the first driving unit 430 is smaller than the second gate-off voltage Voff2 inputted to the third power supply terminal VSS2 of the second driving unit 450. Thus, voltages Vgs of the tenth transistor T10 and the eleventh transistor T11, respectively, are negative voltages, and when a threshold voltage Vth of each of the tenth transistor T10 and the eleventh transistor T11 has a negative value, leakage current flowing through the tenth transistor T10 and the eleventh transistor T11, respectively, is reduced, and accordingly, consumed power may be reduced.

In addition, in the current embodiment, the clock signal applied to the third clock terminal clk3 has the same phase as that of the clock signal applied to the first clock terminal clk1, is repeatedly at a high level and a low level, and has a falling time that precedes a falling time of the clock signal applied to the first clock terminal clk1 by a predetermined time. Thus, the falling time of the gate signal Gi may be reduced compared to the case where the falling time of the clock signal applied to the third clock terminal clk3 and the falling time of the clock signal applied to the first clock terminal clk1 are the same.

The leakage blocking unit 470 maintains the level of the voltage applied to the third node n3 connected to the first node n1 via at least one transistor, thereby blocking leakage current that flows through at least one transistor. The leakage blocking unit 470 includes an eighth transistor T8.

The eighth transistor T8 includes a gate electrode connected to the first node n1, a first electrode connected to a first power supply terminal VDD, and a second electrode connected to the third node n3.

Figure 8:
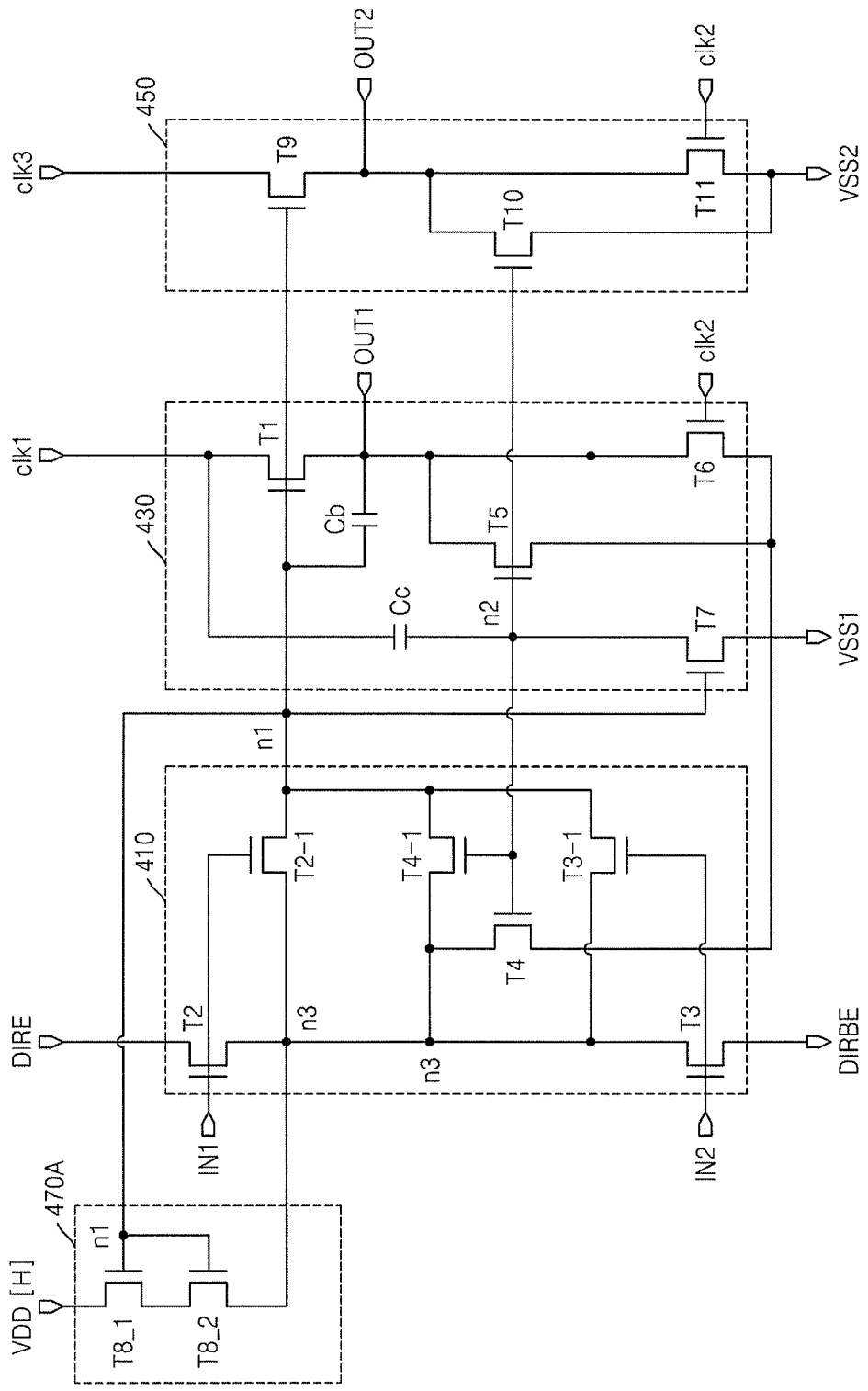

In the current embodiment, the leakage blocking unit 470 is implemented with one eighth transistor T8; however, aspects of the example embodiments are not limited thereto, and a leakage blocking unit 470A (see FIG. 8) may be implemented with two or more transistors. FIG. 8 illustrates an example in which the leakage blocking unit 470A is implemented with two transistors, i.e., a (8-1)-th transistor T8-1, and a (8-2)-th transistor T8-2. In this case, the (8-1)-th transistor T8-1 includes a gate electrode connected to the first node n1, a first electrode connected to the first power supply terminal VDD, and a second electrode connected to a first electrode of the (8-2)-th transistor T8-2. The (8-2)-th transistor T8-2 includes a gate electrode connected to the first node n1, the first electrode connected to the second electrode of the (8-1)-th transistor T8-1, and a second electrode connected to the third node n3.

Figure 9:
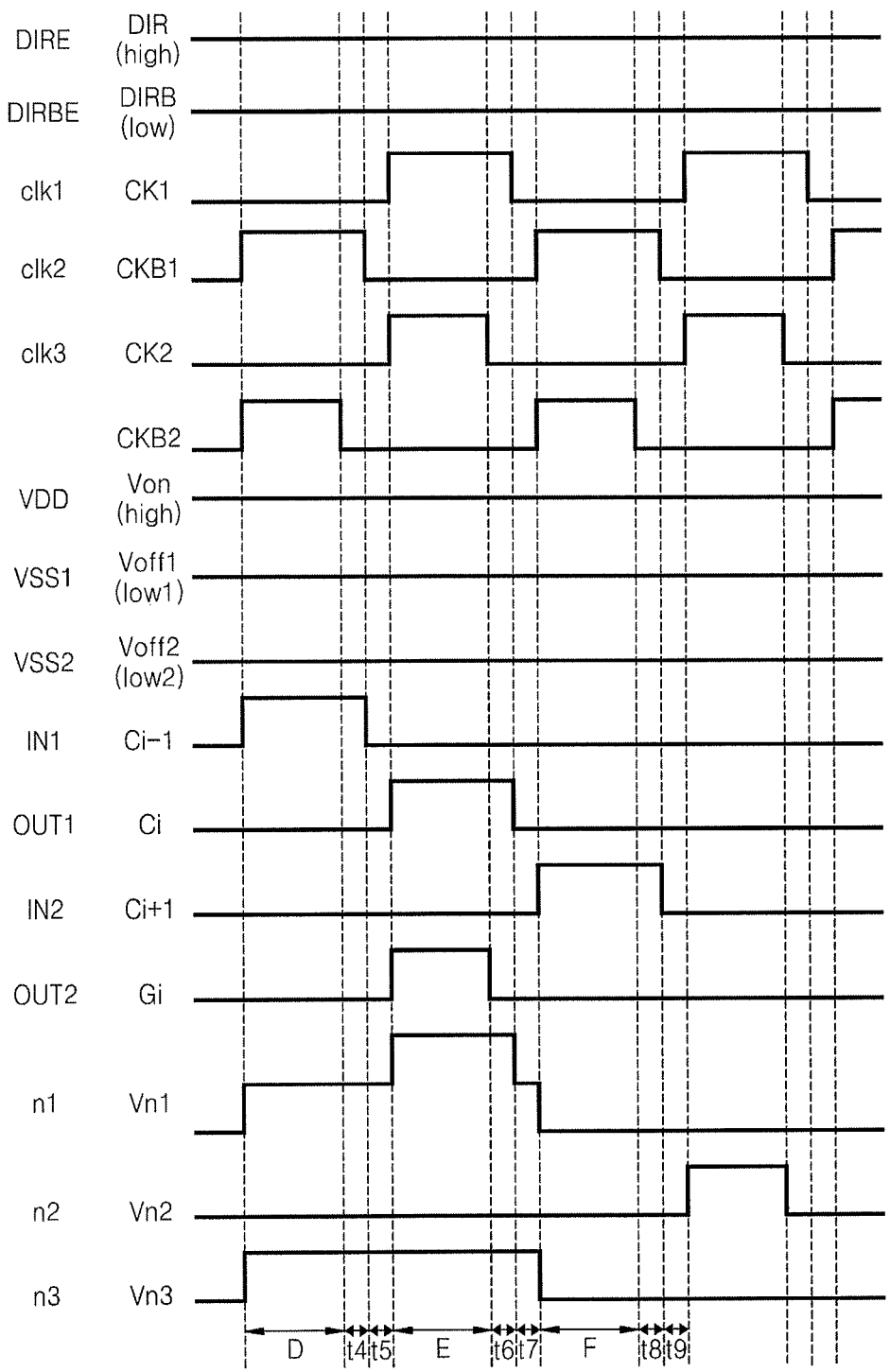
FIG. 9 is a timing diagram illustrating an operation of a gate driving circuit according to an embodiment.

FIG. 9 is a timing diagram illustrating an operation of a gate driving circuit according to an embodiment. An operation of the gate driving circuit illustrated in FIG. 7 will be described with reference to the timing diagram of FIG. 9. FIG. 9 indicates levels of voltages applied to terminals and nodes at an arbitrary odd-numbered stage STi. In the current embodiment, an operation of the gate driving circuit in a forward scan mode in which a first scan direction control signal DIR is applied at a high level and a second scan direction control signal DIRB is applied at a low level will be described.

The first scan direction control signal DIR is inputted to a first scan direction control signal terminal DIRE, and the second scan direction control signal DIRB is inputted to a second scan direction control signal terminal DIRBE. A first clock signal CK1 is inputted to a first clock terminal clk1, and a first inverted clock signal CKB1 is inputted to a second clock terminal clk2, and a second clock signal CK2 is inputted to a third clock terminal clk3. A gate-on voltage Von at a high level is inputted to a first power supply terminal VDD, and gate-off voltages Voff1 and Voff2 at a low level are inputted to a second and third power supply terminals VSS1 and VSS2, respectively. A carry signal Ci−1 at the previous stage STi−1 is inputted to a first input terminal IN1, and a carry signal Ci+1 at the next stage STi−2 is inputted to a second input terminal IN2. Vn1 to Vn3 each indicate a voltage applied to the first to third nodes n1 to n3.

The gate signals and the clock signals illustrated in FIGS. 5A and 5B are used in the current embodiment, as illustrated in FIG. 9.

Figure 10:
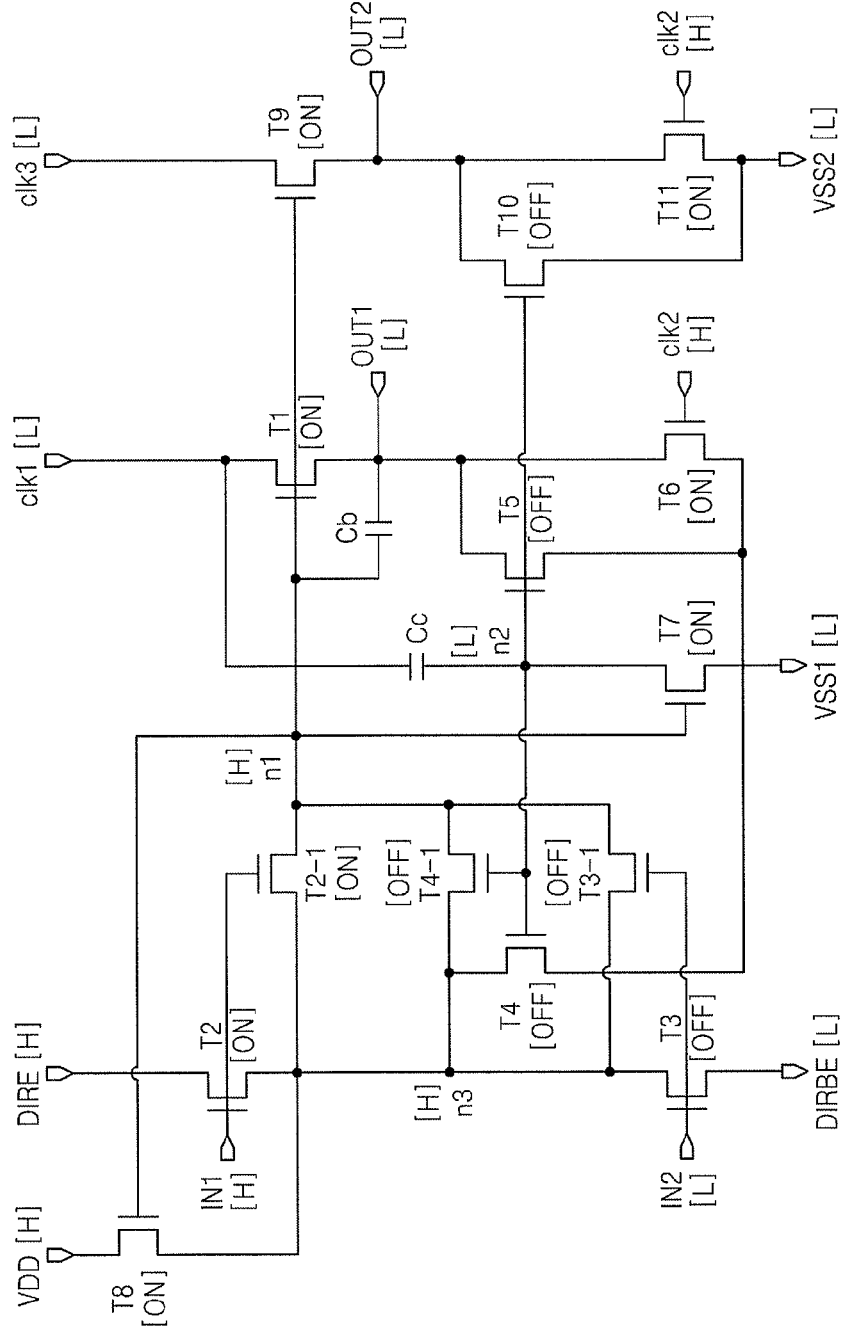
FIG. 10 is a circuit diagram illustrating states of transistors in a stage STi in a period D illustrated in FIG. 9 and levels of voltages applied to terminals and nodes of the transistors.

FIG. 10 is a circuit diagram illustrating states of transistors in a stage STi in a period D illustrated in FIG. 9 and levels of voltages applied to terminals and nodes of the transistors.

Referring to FIGS. 9 and 10, in the period D, a carry signal Ci−1 at a high level is inputted to a first input terminal IN1, and a first inverted clock signal CKB1 at a high level is inputted to a second clock terminal clk2. Thus, a second transistor T2 and a (2-1)-th transistor T2-1 are turned on, a first scan direction control signal DIR at a high level inputted to a first scan direction control signal terminal DIRE is inputted to a third node n3 and a first node n1, a sixth transistor T6 and an eleventh transistor T11 are turned on, and a gate-off voltage Voff1 at a low level is inputted to a first output terminal OUT1, and a gate-off voltage Voff2 at a low level is inputted to a second output terminal OUT2, and the first and the second output terminals OUT1 and OUT2 are maintained at the low level.

Since the first node n1 is at a high level, a seventh transistor T7 is turned on, and the gate-off voltage Voff1 at the low level is inputted to the second node n2. Thus, a fourth transistor T4, a (4-1)-th transistor T4-1, a fifth transistor T5, and a tenth transistor T10 are maintained in a turned off state. Simultaneously, since the first node n1 is at a high level, the first transistor T1 and the ninth transistor T9 are turned on, and a first clock signal CK1 and a second clock signal CK2 each at a low level are inputted to the first output terminal OUT1 and the second output terminal OUT2, respectively. In this regard, since the first clock signal CK1 and the second clock signal CK2 are at a low level, the first clock signal CK1 and the second clock signal CK2 do not collide with the gate-off voltages Voff1 and Voff2 inputted to the first output terminal OUT1 and the second output terminal OUT2, respectively, by using the turned-on sixth transistor T6 and eleventh transistor T11, and the first output terminal OUT1 and the second output terminal OUT2 are maintained at a low level. A carry signal Ci at a low level outputted from the first output terminal OUT1 is inputted to the first input terminal IN1 at the next stage STi+1. The second output terminal OUT2 outputs a gate signal Gi at a low level to a gate line GLi.

Since voltages at a high level and at a low level are inputted to both terminals of a boost capacitor Cb, charge corresponding to a difference between the voltages is charged in the boost capacitor Cb, and since the same voltages at a low level are applied to both terminals of a coupling capacitor Cc, charge is not charged in the coupling capacitor Cc.

As a carry signal Ci+1 at a low level is inputted to the second input terminal IN2, a third transistor T3 and a (3-1)-th transistor T3-1 are maintained in a turned off state.

Since the first node n1 is at a high level, the eight transistor T8 is turned on, and the gate-on voltage Von at a high level is inputted to the third node n3. Thus, the third node n3 may be continuously maintained at the high level.

Since, in periods t4 and t5, the first node n1 at the stage STi is at a high level, the first transistor T1 and the ninth transistor T9 are turned on, and the first clock signal CK1 and the second clock signal CK2 each at a low level are inputted to the first output terminal OUT1 and the second output terminal OUT2, respectively. Thus, in the periods t4 and t5, the gate signal Gi outputted from the second output terminal OUT2 may not be floated, but a gate signal at a low level may be outputted.

Figure 11:
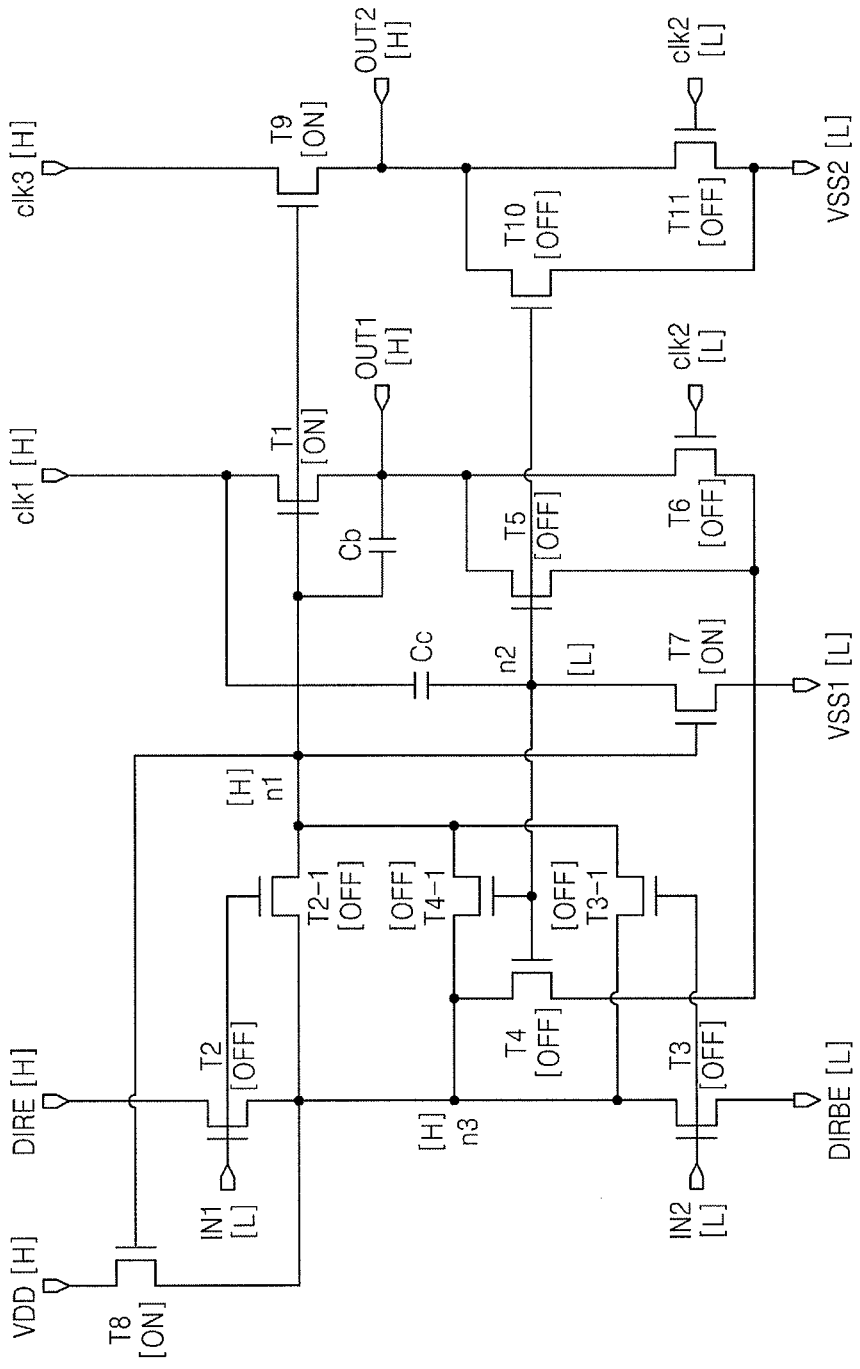
FIG. 11 is a circuit diagram illustrating states of transistors in the stage STi in a period E illustrated in FIG. 9 and levels of voltages applied to terminals and nodes of the transistors.

FIG. 11 is a circuit diagram illustrating states of transistors at the stage STi in a period E illustrated in FIG. 9 and levels of voltages applied to terminals and nodes of the transistors.

Referring to FIGS. 9 and 11, in the period E, the carry signal Ci−1 and the first inverted clock signal CKB1 are at a low level. Thus, the second transistor T2, the (2-1)-th transistor T2-1, the sixth transistor T6, and the eleventh transistor T11 are turned off. Thus, the first node n1 is in a floated state, and the voltage inputted to the first node n1 is maintained at a high level by using the boost capacitor Cb in which charge is charged. Thus, the first transistor T1 and the ninth transistor T9 are maintained in a turned on state.

As the voltage inputted to the first node n1 is continuously maintained at a high level, the seventh transistor T7 is maintained in a turned on state. Thus, the second node n2 is maintained at a low level, and the fourth transistor T4, the fifth transistor T5, and the tenth transistor T10 are maintained in a turned off state.

That is, the first transistor T1 and the ninth transistor T9 are maintained in a turned on state, and the fifth transistor T5, the sixth transistor T6, the tenth transistor T10, and the eleventh transistor T11 are maintained in a turned off state. Here, since the first clock signal CK1 and the second clock signal CK2 are at a high level, the first clock signal CK1 and the second clock signal CK2 each at a high level are inputted to the first transistor T1 and the ninth transistor T9, and the first output terminal OUT1 and the second output terminal OUT2 each output a high level signal.

Thus, the first output terminal OUT1 outputs the carry signal Ci at a high level to the first input terminal IN1 at the next stage STi+1. The second output terminal OUT2 outputs the gate signal Gi at a high level to the gate line GLi.

When the voltages outputted from the first output terminal OUT1 and the second output terminal OUT2 are at a high level, the voltage inputted to the first node n1 is maintained at a higher level than in the period A by using the boost capacitor Cb. Charge corresponding to a difference between the voltage inputted to the first clock signal CK1 at a high level and the voltage inputted to the second node n2 at a low level is charged in the coupling capacitor Cc.

As the carry signal Ci+1 at a low level is inputted to the second input terminal IN2, the third transistor T3 and the (3-1)-th transistor T3-1 are maintained in a turned off state.

Since the first node n1 is at a high level, the eighth transistor T8 is maintained in a turned on state, and the gate-on voltage Von at a high level is inputted to the third node n3. Thus, the third node n3 may be continuously maintained at a high level.

In a period t6, since the voltage inputted to the first node n1 at the stage STi is at a high level, the first transistor T1 and the ninth transistor T9 are turned on, and the first clock signal CK1 at a high level and the second clock signal CK2 at a low level are inputted to the first output terminal OUT1 and the second output terminal OUT2, respectively. In a period t7, since the voltage inputted to the first node n1 at the stage STi is at a high level, the first transistor T1 and the ninth transistor T9 are turned on, and the first clock signal CK1 and the second clock signal CK2 each at a low level are inputted to the first output terminal OUT1 and the second output terminal OUT2, respectively. Thus, in the periods t6 and t7, the gate signal Gi outputted from the second output terminal OUT2 may not be floated, but a gate signal at a low level may be outputted.

Figure 12:
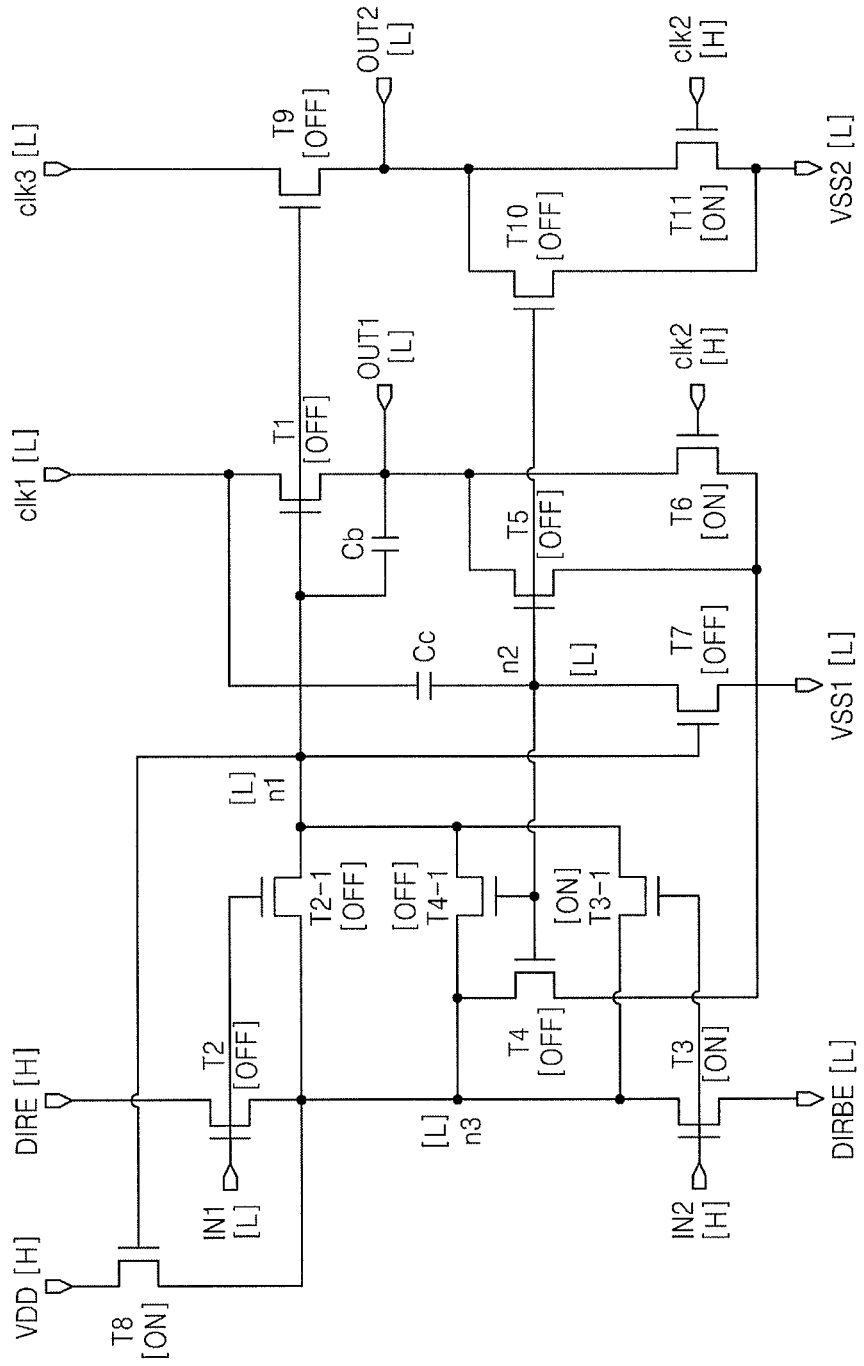
FIG. 12 is a circuit diagram illustrating states of transistors in the stage STi in a period F illustrated in FIG. 9 and levels of voltages applied to terminals and nodes of the transistors.

FIG. 12 is a circuit diagram illustrating states of transistors at the stage STi in a period F illustrated in FIG. 9 and levels of voltages applied to terminals and nodes of the transistors.

Referring to FIGS. 9 and 12, in the period F, the carry signal Ci+1 inputted from the next stage is at a high level and is inputted to the second input terminal IN2. Thus, the third transistor T3 and the (3-1)-th transistor T3-1 are in a turned on state, and the second scan direction control signal DIRB at a low level is inputted to the third node n3 and the first node n1, respectively. Thus, the voltages inputted to the first node n1 and the third node n3 transit from the high level to the low level.

Since the voltage inputted to the first node n1 is at a low level, the first transistor T1, the seventh transistor T7, and the ninth transistor T9 are in a turned off state, and the second node n2 is floated in a low level state. Thus, the fourth transistor T4, the fifth transistor T5, and the tenth transistor T10 are maintained in a turned off state.

In this regard, since the first clock signal CK1 is at a low level, the same voltages at a low level are inputted to both terminals of the coupling capacitor Cc, and the voltage inputted to the second node n2 is maintained at a low level.

Since the first inverted clock signal CKB1 at a high level is inputted to the second clock terminal clk2, the sixth transistor T6 and the eleventh transistor T11 are turned on, and the gate-off voltage Voff at a low level is outputted from the first output terminal OUT1 and the second output terminal OUT2, respectively.

Thus, the first output terminal OUT1 outputs the carry signal Ci at a low level to the first input terminal IN1 at the next stage STi+1. The second output terminal OUT2 outputs the gate signal Gi at a low level to the gate line GLi.

In a period t8, since the voltage inputted to the first node n1 at the stage STi is at a low level, the first transistor T1 and the ninth transistor T9 are turned off, and since the first inverted clock signal CKB1 at a high level is inputted to the second clock terminal clk2, the sixth transistor T6 and the eleventh transistor T11 are turned on, and the gate-off voltage Voff (Voff1 and Voff2) at a low level is outputted from the first output terminal OUT1 and the second output terminal OUT2, respectively. Thus, in the period t8, the gate signal Gi outputted from the second output terminal OUT2 may not be floated, but a gate signal at a low level may be outputted. In a period t9, since the voltage inputted to the first node n1 at the stage STi is at a low level, the first transistor T1 and the ninth transistor T9 are turned off, and since the first inverted clock signal CKB1 at a low level is inputted to the second clock terminal clk2, the sixth transistor T6 and the ninth transistor T11 are turned off. Thus, the voltages outputted from the first output terminal OUT1 and the second output terminal OUT2 are maintained at the low level in the period t8 and output the carry signal Ci and the gate signal Gi, respectively. That is, in the period t9, the gate signal Gi is floated.

The periods t1, t2, and t3 illustrated in FIG. 4 correspond to the periods t4 and t5 of FIG. 9, the periods t6 and t7 of FIG. 9, and the periods t8 and t9 of FIG. 9, respectively. For example, the period t1 corresponds to the periods t4 and t5.

In the gate driving circuit of FIG. 3, the level of the voltage inputted to the third node n3 is controlled in response to the gate signal Gi. Thus, in the periods t1 and t2 of FIG. 4, the gate signal Gi is at a low level, and the third node n3 is floated. In the current embodiment, when the voltage inputted to the first node n1 is at a high level, the eighth transistor T8 of the leakage blocking unit 470 is turned on, and the gate-on voltage Von at a high level is inputted to the third node n3. Thus, in the periods t4 and t5 of FIG. 9 and the periods t6 and t7 of FIG. 9, the third node n3 is not floated, and leakage may be blocked.

In addition, since, in the period t3 of FIG. 4, the voltage inputted to the first node n1 is at a low level and the inverted clock signal CKB is also at a low level, an output of the gate signal Gi is floated. On the other hand, in the current embodiment, the clock signal applied to the third clock terminal clk3 has the same phase as that of the clock signal applied to the first clock terminal clk1 but has a falling time that precedes a falling time of the clock signal applied to the first clock terminal clk1 by a predetermined time. Thus, in the period t8 of FIG. 9, the output of the gate signal Gi is not floated, and only in the period t9, the output of the gate signal Gi is floated. Thus, the floating time of the gate signal Gi in FIG. 9 is reduced compared to FIG. 4, and operating stability of the gate driving circuit may be improved.

As described above, the operation of the gate driving circuit at the odd-numbered stages has been described. An even-numbered stage STi+1 is different from the odd-numbered stages in that the first inverted clock signal CKB1 is inputted to the first clock terminal clk1, the first clock signal CK1 is inputted to the second clock terminal clk2, and the second inverted clock signal CKB2 is inputted to the third clock terminal clk3. However, an operation of the gate driving circuit is similar, and the detailed description thereof is omitted.

Figure 13A:
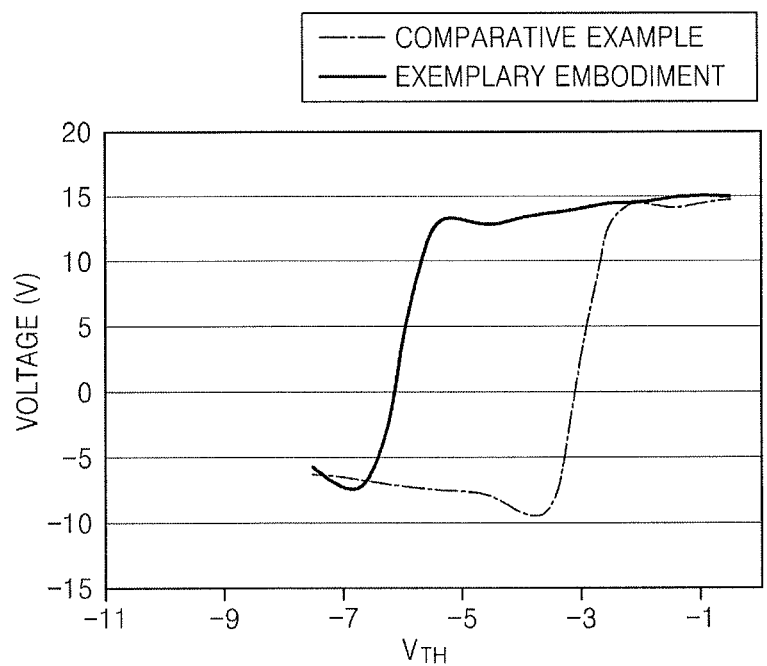
FIGS. 13A and 13B are graphs illustrating a range of a gate-on voltage according to a change in a threshold voltage of a transistor according to an example embodiment and a comparative example, respectively.
Figure 13B:
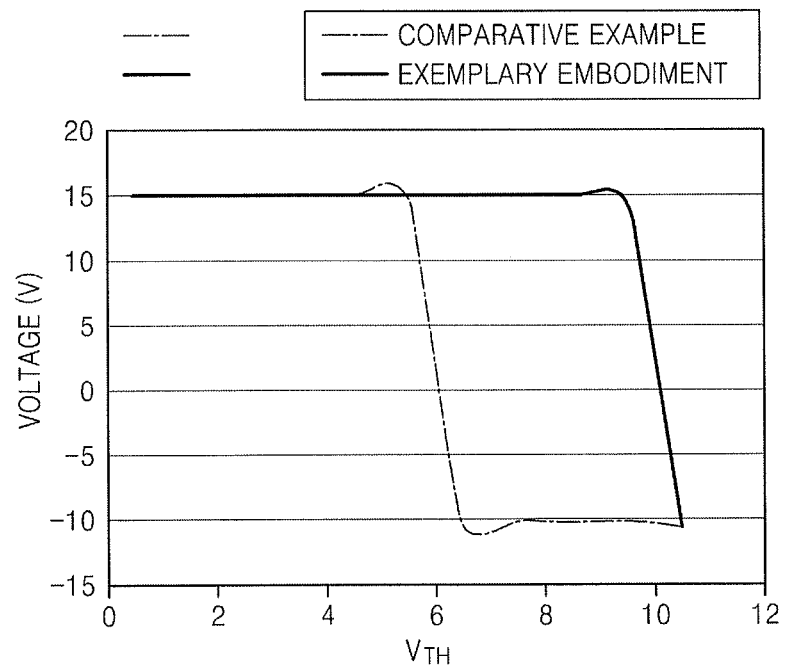

FIGS. 13A and 13B are graphs illustrating a range of a gate-on voltage according to a change in a threshold voltage of a transistor according to ab example embodiment and a comparative example, respectively.

A chain line, i.e., a dashed line, indicates a change in a gate-on voltage according to a change in a threshold voltage Vth of a transistor of a general gate driving circuit (FIG. 3) according to a comparative example, and a solid line indicates a change in a gate-on voltage according to a change in a threshold voltage Vth of a transistor of a gate driving circuit according to an embodiment.

In the general gate driving circuit, the gate-on voltage at a high level is outputted only when the threshold voltage Vth of the transistor is within the range of −2.5 V to +5.5 V.

In the leakage blocking unit 470 according to the example embodiments, the gate-on voltage Von at a high level is continuously inputted to the third node n3 via the eighth transistor T8. Thus, in the periods t4 and t5, even when the threshold voltage Vth of each of the second transistor T2 and the third transistor T3 has a negative value and leakage current is generated in the second transistor T2 and the third transistor T3, the third node n3 may not be floated by supply of the gate-on voltage Von via the leakage blocking unit 470, but the voltage inputted to the third node n3 may be continuously maintained at a high level. Thus, even when the threshold voltage Vth of the transistor is changed in the range of −5.5 V to +9.5 V, the gate-on voltage Von at a high level may be outputted. That is, the gate driving circuit according to the example embodiments may increase an operating margin caused by a change in the threshold voltage Vth of the transistor.

Figure 14:
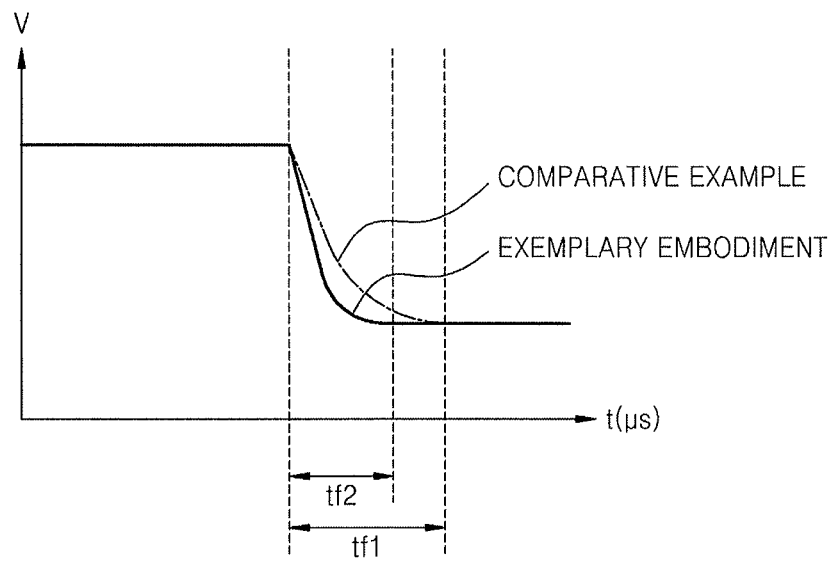
FIG. 14 is a graph illustrating a falling time of a gate signal according to an example embodiment and a comparative example.

FIG. 14 is a graph illustrating a falling time of a gate signal according to an example embodiment and a comparative example, respectively. The falling time is defined as time during a level of a gate signal is fallen from a high level to a low level.

Referring to FIG. 14, a falling time tf2 of a gate signal according to an embodiment (FIG. 7) may be decreased compared to a falling time tf1 of a gate signal according to a comparative example (FIG. 3).

In the embodiment, a driving unit is divided into a first driving unit 430 and a second driving unit 450 to operate a shift register in response to a carry signal Ci outputted from the first driving circuit 430, and a gate signal Gi is outputted from the second driving unit 450 via a gate line GLi. In addition, a falling time of a first clock signal CK1 inputted to the first driving unit 430 and a falling time of a second clock signal CK2 inputted to the second driving unit 450 are set differently. That is, the first clock signal CK1 falls after the second clock signal CK2 has fallen and is delayed by a predetermined time t6.

In the comparative example, at a starting time of t2, the first node n1 is a gate-on voltage Von at a high level, and a clock signal CK inputted to the first transistor T1 falls to a low level. The clock signal CK at a low level is a gate-off voltage Voff. Thus, a voltage Vgs of the first transistor T1 has a maximum swing voltage Vswing. Here, the swing voltage Vswing is defined as Vswing=Von−Voff. For example, when the gate-on voltage Von is 15 V and the gate-off voltage Voff is −12 V, the swing voltage Vswing is 27 V.

On the other hand, in the example embodiment, at a starting time of t6, the second clock signal CK2 falls to a low level, and at a starting time of t7, the first clock signal CK1 falls to a low level. The first clock signal CK1 at the low level is a first gate-off voltage Voff1, and the second clock signal CK2 at the low level is a second gate-off voltage Voff2. Since the first gate-off voltage Voff1 is smaller than the second gate-off voltage Voff2, a swing voltage Vswing is defined as Vswing=Von−Voff1. At a starting time of t6, a voltage inputted to the first node n1 is (Von+Vswing), and a voltage Vgs of a ninth transistor T9 has a maximum double swing voltage 2Vswing. Thus, the voltage Vgs of the ninth transistor T9 is increased, and a driving ability of the ninth transistor T9 is increased, and the falling time tf2 of the gate signal is reduced. In addition, the falling time tf2 of the gate signal is reduced compared to the case where the signal inputted to the first clock terminal clk1 and the signal inputted to the third clock terminal clk3 are the same.

As described above, a gate driving circuit according to the example embodiments may have a wide operating margin when a threshold voltage of a transistor is changed and may reduce a falling time of a gate signal so that a driving speed of the gate driving circuit may be increased, the area of a gate output terminal may be reduced, and a slim black matrix (BM) may be achieved. In addition, a floating period in which gate signals are outputted may be reduced, and the reliability of the gate driving circuit may be improved.

While example embodiments have been particularly shown and described, it will be understood by those of ordinary skill in the art that various changes in form and details may be made therein without departing from the spirit and scope of the example embodiments as defined by the following claims.

What is claimed is:

1. A gate driving circuit, comprising:
a plurality of stages configured to output gate signals in response to first and second input signals and in response to first through third clock signals input to the plurality of stages,
wherein each of the plurality of stages includes:
an input unit configured to determine a level of voltage to be input to a first node based on the first input signal as a carry signal input from a previous stage and the second input signal as a carry signal input from a next stage;
a first driving unit configured to output carry signals to the next stage, the carry signals being based on the first clock signal that is input according to the level of the voltage input to the first node and a first gate-off voltage that is input in response to the second clock signal;
a second driving unit configured to output the gate signals based on the third clock signal that is input according to the level of the voltage input to the first node and a second gate-off voltage that is input in response to the second clock signal; and
a leakage blocking unit configured to block leakage current of a transistor by maintaining a level of voltage input to a third node connected to the first node via at least one transistor.

2. The gate driving circuit of claim 1, wherein the first gate-off voltage is smaller than the second gate-off voltage.

3. The gate driving circuit of claim 1, wherein:
the second clock signal is an inverted signal of the first clock signal, and the first clock signal and the second clock signal have a non-overlapping period, and
the third clock signal input to the even-numbered stages is an inverted signal of a third clock signal input to the odd-numbered stages, and the third clock signal input to the odd-numbered stages and the third clock signal input to the even-numbered stages have a non-overlapping period.

4. The gate driving circuit of claim 1, wherein the third clock signal has a different voltage level from a voltage level of the first clock signal, a same phase as a phase of the first clock signal, and a falling time that precedes a falling time of the first clock signal.

5. The gate driving circuit of claim 4, wherein the first clock signal is a signal for swinging a gate-on voltage and the first gate-off voltage, and the third clock signal is a signal for swinging a gate-on voltage and the second gate-off voltage.

6. The gate driving circuit of claim 1, wherein the input unit includes:
a second transistor having a gate electrode connected to a first input terminal to which the first input signal is applied, a first electrode connected to a first scan direction control signal terminal to which a first scan direction control signal is applied, and a second electrode connected to the third node;
a (2-1)-th transistor having a gate electrode connected to the first input terminal, a first electrode connected to the third node, and a second electrode connected to the first node;
a third transistor having a gate electrode connected to a second input terminal to which the second input signal is applied, a first electrode connected to the third node, and a second electrode connected to a second scan direction control signal terminal to which a second scan direction control signal is applied;
a (3-1)-th transistor having a gate electrode connected to the second input terminal, a first electrode connected to the third node, and a second electrode connected to the first node;
a fourth transistor having a gate electrode connected to a second node, a first electrode connected to the third node, and a second electrode connected to a second power supply terminal to which the first gate-off voltage is applied; and
a (4-1)-th transistor having a gate electrode connected to the second node, a first electrode connected to the third node, and a second electrode connected to the first node.

7. The gate driving circuit of claim 1, wherein the first driving unit includes:
a first transistor having a gate electrode connected to the first node, a first electrode connected to a first clock terminal to which the first clock signal is applied and a second electrode connected to a first output terminal from which carry signals are output to the next stage;
a fifth transistor having a gate electrode connected to a second node, a first electrode connected to the first output terminal, and a second electrode connected to a second power supply terminal to which the first gate-off voltage is applied;

a sixth transistor having a gate electrode connected to a second clock terminal to which the second clock signal is applied, a first electrode connected to the first output terminal, and a second electrode connected to the second power supply terminal;

a seventh transistor having a gate electrode connected to the first node, a first electrode connected to the second node, and a second electrode connected to the second power supply terminal;

a boost capacitor connected between the first node and the first output terminal; and a coupling capacitor connected between the first clock terminal and the second node.

8. The gate driving circuit of claim 1, wherein the second driving unit includes:

a ninth transistor having a gate electrode connected to the first node, a first electrode connected to a third clock terminal to which the third clock signal is applied, and a second electrode connected to a second output terminal for outputting the gate signals;

a tenth transistor having a gate electrode connected to a second node, a first electrode connected to the second output terminal, and a second electrode connected to a third power supply terminal to which the second gate-off voltage is applied; and an eleventh transistor having a gate electrode connected to a second clock terminal to which the second clock signal is applied, a first electrode connected to the second output terminal, and a second electrode connected to the third power supply terminal.

9. The gate driving circuit of claim 1, wherein the leakage blocking unit includes an eighth transistor having a gate electrode connected to the first node, a first electrode connected to a first power supply terminal, to which a gate-on voltage is applied, and a second electrode connected to the third node.

10. The gate driving circuit of claim 1, wherein the gate driving circuit is configured to drive a liquid crystal display (LCD) apparatus and includes a plurality of oxide thin film transistors.

11. A display apparatus, comprising:

a display panel including a plurality of pixels at intersection regions of a plurality of data lines and a plurality of gate lines;

a data driving unit connected to the plurality of data lines, the data driving unit being configured to apply data signals to the data lines; and a gate driving unit connected to the plurality of gate lines, the gate driving unit including a plurality of stages configured to output gate signals in response to first and second input signals and in response to first through third clock signals input to the plurality of stages, each of the plurality of stages includes:

an input unit configured to determine a level of voltage to be input to a first node based on the first input signal as a carry signal input from a previous stage and the second input signal as a carry signal input from a next stage, a first driving unit configured to output carry signals to the next stage, the carry signals being based on the first clock signal that is input according to the level of the voltage input to the first node and a first gate-off voltage that is input in response to the second clock signal, a second driving unit configured to output the gate signals based on the third clock signal that is input according to the level of the voltage input to the first node and a second gate-off voltage that is input in response to the second clock signal, and a leakage blocking unit configured to block leakage current of a transistor by maintaining a level of voltage input to a third node connected to the first node via at least one transistor.

12. The display apparatus of claim 11, wherein the first gate-off voltage is smaller than the second gate-off voltage.

13. The display apparatus of claim 11, wherein:

the second clock signal is an inverted signal of the first clock signal, and the first clock signal and the second clock signal have a non-overlapping period, and the third clock signal input to the even-numbered stages is an inverted signal of a third clock signal input to the odd-numbered stages, and the third clock signal input to the odd-numbered stages and the third clock signal input to the even-numbered stages have a non-overlapping period.

14. The display apparatus of claim 11, wherein the third clock signal has a different voltage level from a voltage level of the first clock signal, a same phase as a phase of the first clock signal, and a falling time that precedes a falling time of the first clock signal.

15. The display apparatus of claim 14, wherein the first clock signal is a signal for swinging a gate-on voltage and the first gate-off voltage, and the third clock signal is a signal for swinging a gate-on voltage and the second gate-off voltage.

16. The display apparatus of claim 11, wherein the input unit includes:

a second transistor having a gate electrode connected to the first input terminal, to which the first input signal is applied, a first electrode connected to a first scan direction control signal terminal, to which a first scan direction control signal is applied, and a second electrode connected to the third node;

a (2-1)-th transistor having a gate electrode connected to the first input terminal, a first electrode connected to the third node, and a second electrode connected to the first node;

a third transistor having a gate electrode connected to the second input terminal, to which the second input signal is applied, a first electrode connected to the third node, and a second electrode connected to a second scan direction control signal terminal, to which a second scan direction control signal is applied;

a (3-1)-th transistor having a gate electrode connected to the second input terminal, a first electrode connected to the third node, and a second electrode connected to the first node;

a fourth transistor having a gate electrode connected to a second node, a first electrode connected to the third node, and a second electrode connected to a second power supply terminal to which the first gate-off voltage is applied; and a (4-1)-th transistor having a gate electrode connected to the second node, a first electrode connected to the third node, and a second electrode connected to the first node.

17. The display apparatus of claim 11, wherein the first driving unit includes:

a first transistor having a gate electrode connected to the first node, a first electrode connected to a first clock terminal to which the first clock signal is applied, and a second electrode connected to a first output terminal from which carry signals are outputted to the next stage;

a fifth transistor having a gate electrode connected to a second node, a first electrode connected to the first output terminal, and a second electrode connected to a second power supply terminal to which the first gate-off voltage is applied;

a sixth transistor having a gate electrode connected to a second clock terminal to which the second clock signal is applied, a first electrode connected to the first output terminal, and a second electrode connected to the second power supply terminal;

a seventh transistor having a gate electrode connected to the first node, a first electrode connected to the second node, and a second electrode connected to the second power supply terminal;

a boost capacitor connected between the first node and the first output terminal; and a coupling capacitor connected between the first clock terminal and the second node.

18. The display apparatus of claim 11, wherein the second driving unit includes:

a ninth transistor having a gate electrode connected to the first node, a first electrode connected to a third clock terminal to which the third clock signal is applied, and a second electrode connected to a second output terminal for outputting the gate signals;

a tenth transistor having a gate electrode connected to a second node, a first electrode connected to the second output terminal, and a second electrode connected to a third power supply terminal to which the second gate-off voltage is applied; and an eleventh transistor having a gate electrode connected to a second clock terminal to which the second clock signal is applied, a first electrode connected to the second output terminal, and a second electrode connected to the third power supply terminal.

19. The display apparatus of claim 11, wherein the leakage blocking unit includes an eighth transistor having a gate electrode connected to the first node, a first electrode connected to a first power supply terminal to which a gate-on voltage is applied, and a second electrode connected to the third node.

20. The display apparatus of claim 11, wherein the gate driving circuit includes a plurality of oxide thin film transistors.

* * * * *